(12) United States Patent
Wang et al.

(10) Patent No.: US 9,666,672 B2
(45) Date of Patent: May 30, 2017

(54) FINFET DEVICE

(71) Applicant: Taiwan Semiconductor Manufacturing Company, Ltd., Hsin-Chu (TW)

(72) Inventors: Chih-Hao Wang, Hsinchu County (TW); Ching-Wei Tsai, Hsinchu (TW); Chin-Chi Wang, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/150,219

(22) Filed: May 9, 2016

(65) Prior Publication Data
US 2016/0254353 A1 Sep. 1, 2016

Related U.S. Application Data

(62) Division of application No. 14/136,050, filed on Dec. 20, 2013, now Pat. No. 9,337,258.

(51) Int. Cl.
| | |
|---|---|
| *H01L 29/10* | (2006.01) |
| *H01L 21/762* | (2006.01) |
| *H01L 29/06* | (2006.01) |
| *H01L 21/8238* | (2006.01) |
| *H01L 21/84* | (2006.01) |
| *H01L 27/092* | (2006.01) |
| *H01L 29/66* | (2006.01) |

(52) U.S. Cl.
CPC .... *H01L 29/1054* (2013.01); *H01L 21/76224* (2013.01); *H01L 21/823807* (2013.01); *H01L 21/823821* (2013.01); *H01L 21/823878* (2013.01); *H01L 21/845* (2013.01); *H01L 27/0924* (2013.01); *H01L 29/0649* (2013.01); *H01L 29/0653* (2013.01); *H01L 29/6681* (2013.01)

(58) Field of Classification Search
CPC .............. H01L 21/823821; H01L 29/6681
See application file for complete search history.

(56) References Cited

U.S. PATENT DOCUMENTS

| | | | |
|---|---|---|---|
| 8,361,871 B2 | 1/2013 | Pillarisetty et al. | |
| 9,087,869 B2 | 7/2015 | Adam et al. | |
| 9,142,402 B2 | 9/2015 | Liou et al. | |
| 2008/0265338 A1* | 10/2008 | Yu | H01L 29/66795 257/397 |
| 2009/0159972 A1* | 6/2009 | Jakschik | H01L 21/84 257/350 |
| 2013/0320546 A1* | 12/2013 | Holmes | H01L 23/485 257/763 |

* cited by examiner

*Primary Examiner* — Dung Le
(74) *Attorney, Agent, or Firm* — Haynes and Boone, LLP

(57) ABSTRACT

A device includes a first fin including a first semiconductor material. A first dielectric layer is disposed over a top surface of the first fin. A sidewall of the first dielectric layer has a dip-shape profile. A second dielectric layer is disposed along sidewalls of the first fin. A top surface of the second dielectric layer is substantially coplanar with the top surface of the first fin. A second fin includes a second semiconductor material different from the first semiconductor material. An isolation region is disposed between the first fin and the second fin.

19 Claims, 15 Drawing Sheets

FINFET DEVICE

CROSS-REFERENCES TO RELATED APPLICATIONS

The present application is a Divisional of U.S. patent application Ser. No. 14/136,050, entitled "METHOD OF MAKING A FINFET DEVICE," filed Dec. 20, 2013, which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
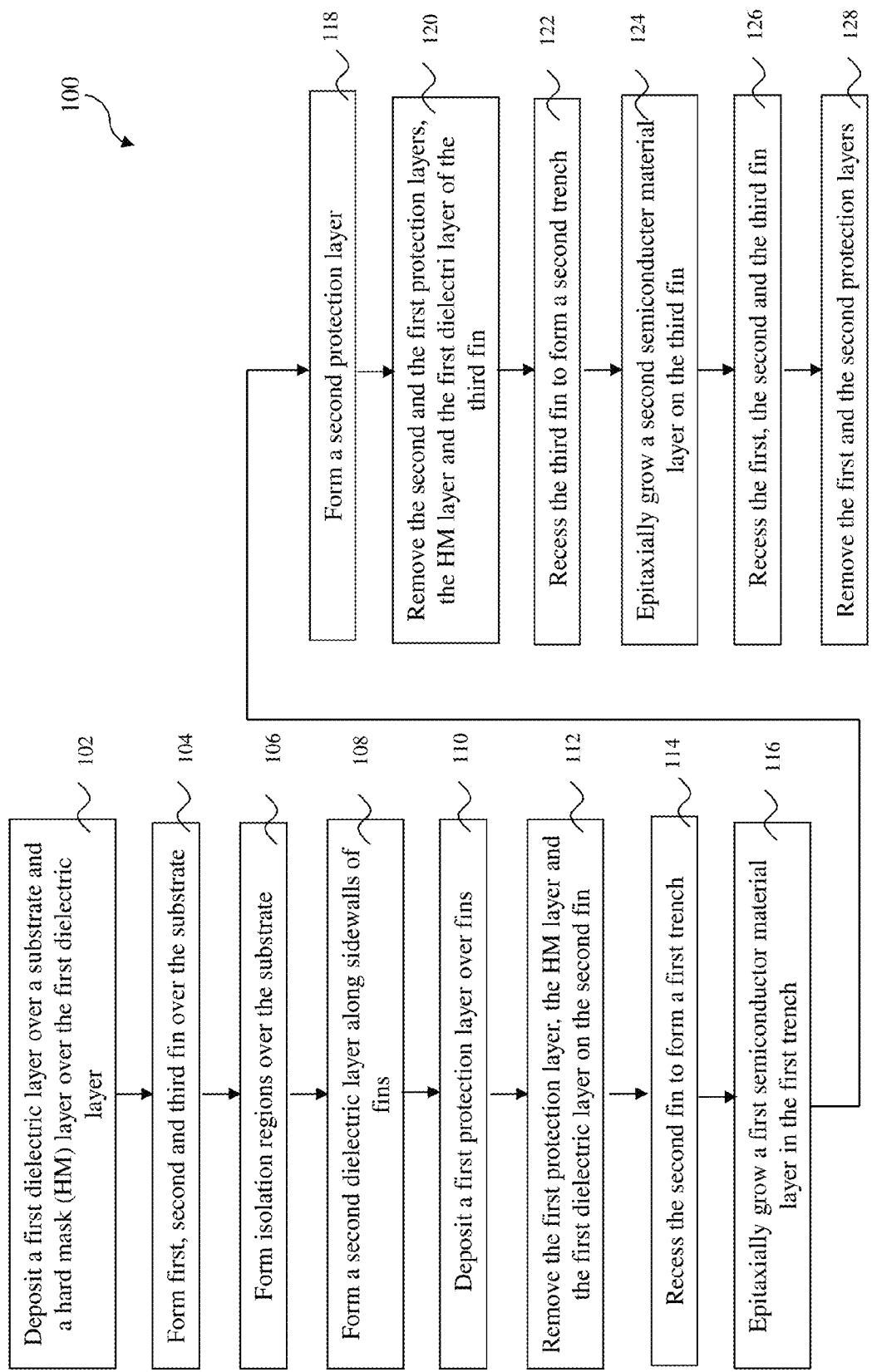
FIG. 1 is a flow chart of an example method for fabricating a FinFET device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of a method 100 for fabricating a device 200 according to aspects of the present disclosure. FIGS. 2 through 15 are cross-sectional views of the device 200 at fabrication stages constructed according to the method 100 of FIG. 1. The method 100 and the device 200 are collectively described with reference to FIG. 1 through FIG. 15. It is understood that additional steps can be provided before, during, and after the method 100, and some of the steps described can be replaced or eliminated for other embodiments of the method.

Figure 2:
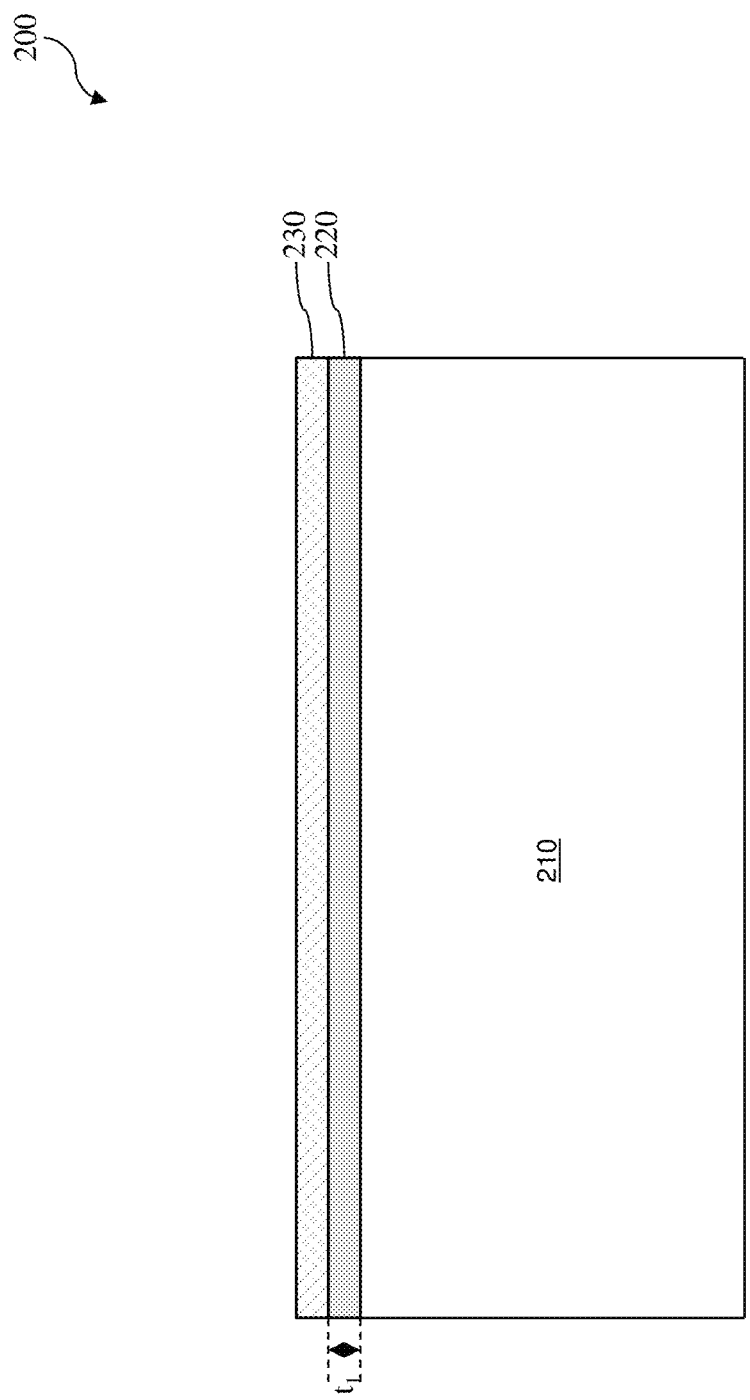
FIGS. 2 to 15 are cross-sectional views of an example FinFET device at fabrication stages constructed according to the method of FIG. 1.

Referring to FIGS. 1 and 2, the method 100 begins at step 102 by depositing a first dielectric layer 220 and a hard mask layer 230 over a substrate 210. The substrate 210 may be a bulk silicon substrate. Alternatively, the substrate 210 may include an elementary semiconductor, such as silicon or germanium in a crystalline structure; a compound semiconductor, such as silicon germanium, silicon carbide, gallium arsenide, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET precursors, the insulator layer is a component (e.g., layer) of a silicon-on-insulator substrate.

The substrate 210 may include various doped regions depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

In the present embodiment, the first dielectric layer 220 may be deposited by thermal oxidation, chemical oxidation, chemical vapor deposition (CVD), or any appropriate method. The first dielectric layer 220 may include silicon oxide, silicon oxynitride, or other suitable material. The first dielectric layer 220 has a first thickness $t_1$. In one embodiment, the first dielectric layer 220 is formed with a process temperature higher than 450° C. The hard mask (HM) layer 230 includes silicon nitride, silicon carbide, titanium oxide, titanium nitride, tantalum oxide, tantalum nitride, or any suitable materials. In addition, the HM layer 230 may include a single layer or multiple layers. The HM layer 230 is different from the first dielectric layer 220 to achieve etching selectivity during a subsequent etch, which will be described later. The HM layer 230 may be deposited by suitable techniques, such as CVD, or physical vapor deposition (PVD).

Figure 3:
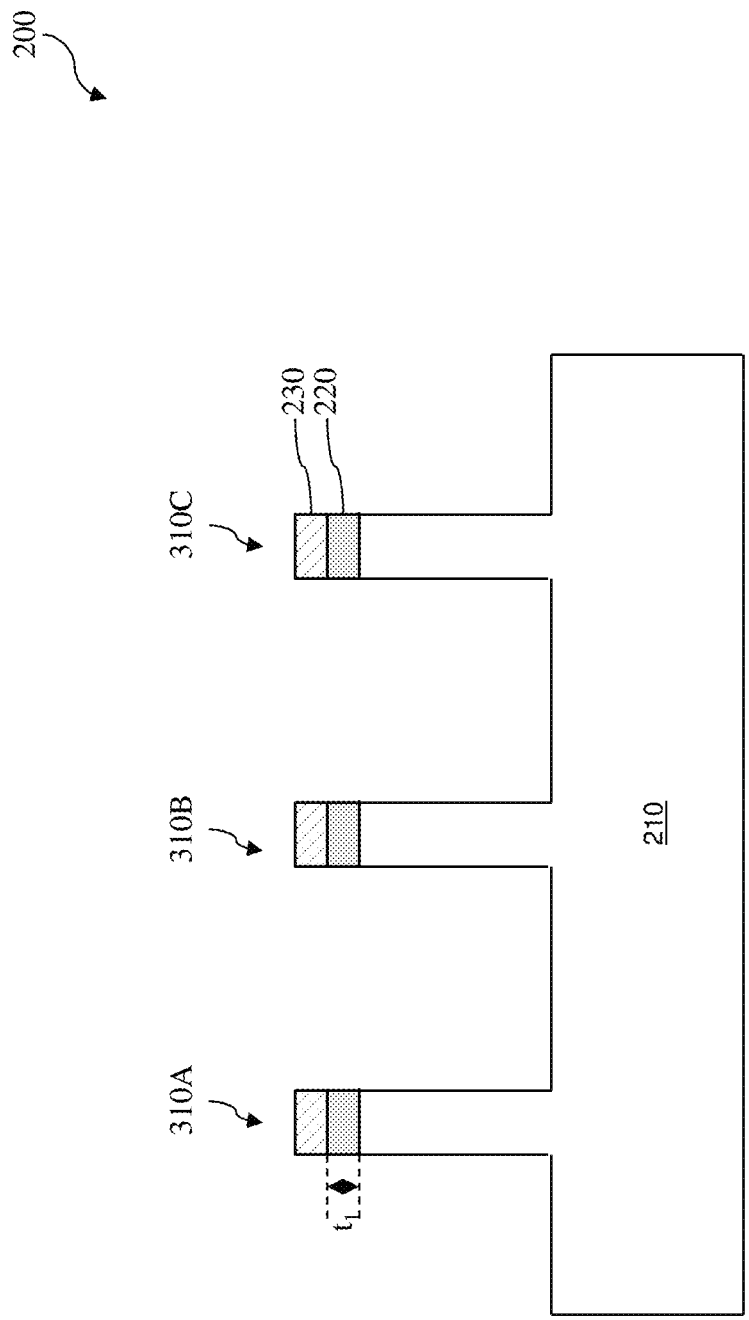

Referring to FIGS. 1 and 3, the method 100 proceeds to step 104 by forming fins 310 over the substrate 210. In some embodiments, more than one fin 310 is formed on the substrate 210. The fins 310 are formed by any suitable process including photolithography and etching processes. An exemplary photolithography process includes forming a photoresist layer (resist) over the substrate 210, exposing the resist and developing the resist to form a patterned resist. The HM layer 230, the first dielectric layer 220 and the substrate 210 are then etched through the patterned resist to form fins 310. Alternatively, the HM layer 230 is etched through the patterned resist first, and the substrate 210 is etched through the etched HM layer 230 to form fins 310. The etch process may include a selective wet etch or a selective dry etch. A wet etching solution includes a tetramethylammonium hydroxide (TMAH), a $HF/HNO_3/CH_3COOH$ solution, or other suitable solution. Dry etching processes include a biased plasma etching process that uses a chlorine-based chemistry. Other dry etchant gasses include $CF_4$, $NF_3$, $SF_6$, and He. For the sake of clarity to better describing the method 100, now labeling fins 310 with the reference number 310A, 310B and 310C, respectively. These fins may serve for different device elements. For example, the fin 310A serves for an I/O element, the fin 310B severs for a P-type FET and the fin 310C serves for an N-type FET.

Figure 4:
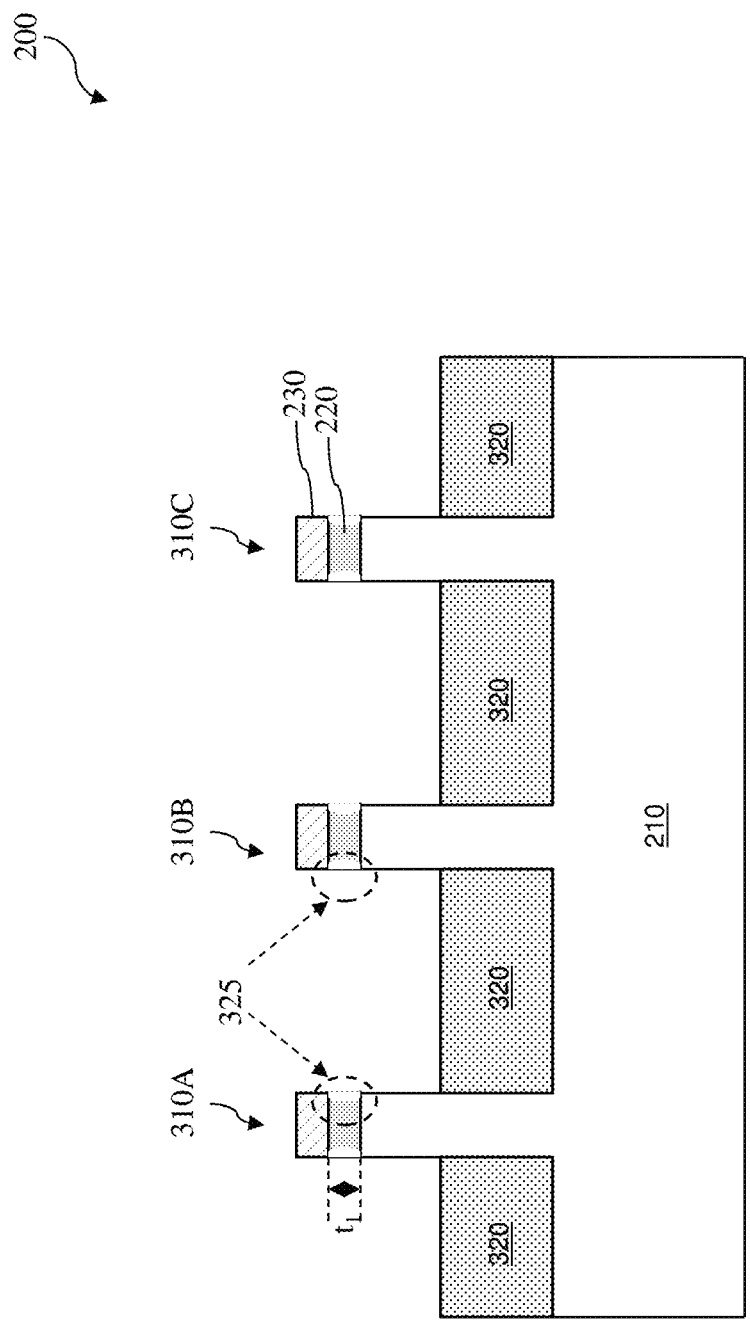

Referring to FIGS. 1 and 4, the method 100 proceeds to step 106 by forming isolation region 320 on the substrate 210 to isolate active regions of the substrate 210. For example, the isolation region 320 separates the fins 310. The isolation region 320 may be formed using traditional isolation technology, such as shallow trench isolation (STI). In one embodiment, an isolation dielectric layer is deposited over the substrate 210, including filling in a space between fins 310. The isolation dielectric layer includes silicon oxide, silicon nitride, silicon oxynitride, or other suitable materials, or combinations thereof. The isolation dielectric layer is deposited by CVD, ALD, or any other suitable techniques. A chemical mechanical polishing (CMP) process may be performed subsequently to remove excess isolation dielectric layer. The isolation dielectric layer is further recessed to expose a portion of the fin 310 and form the isolation region 320. The recess process may include wet etch and dry etch. In one embodiment, during the recess process, an outside edge of the first dielectric layer 220 is etched to form a dip-shape profile sidewall 325 on top of the fin 310.

Figure 5:
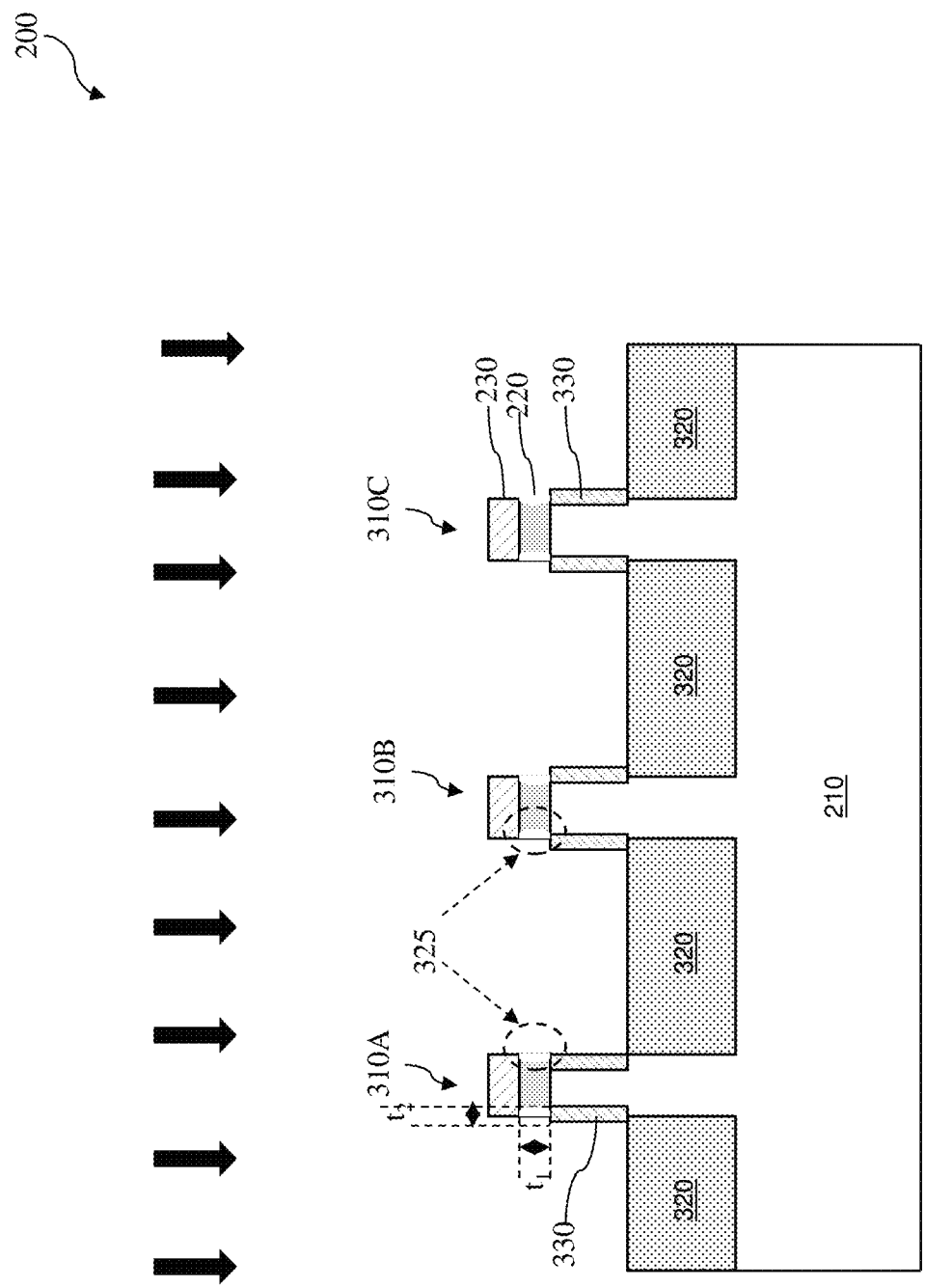

Referring to FIGS. 1 and 5, the method 100 proceeds to step 108 by forming a second dielectric layer 330. The second dielectric layer 330 may be formed by an anneal process. The anneal process may be conducted in a combination of steam ambient and oxygen ambient, or under an inert gas atmosphere. The anneal process has a temperature higher than 450 C. In one embodiment, the second dielectric layer 330 is silicon oxide formed by the anneal process. In the present embodiment, the second dielectric layer 330 is formed conformably along sidewalls of the fin 310, having a second thickness $t_2$. The second thickness $t_2$ may be substantially different to the first thickness $t_1$. In one embodiment, the first thickness $t_1$ is in a range from 30 Å to 50 Å and the second thickness $t_2$ is in a range from 10 Å to 30 Å. The second thickness $t_2$ may be controlled by the thermal annealing conditions, such as annealing temperature and annealing time. In one embodiment, the first dielectric layer 220 and the second dielectric layer 330 are together to serve as a gate dielectric layer for the fin 310A.

Figure 6:
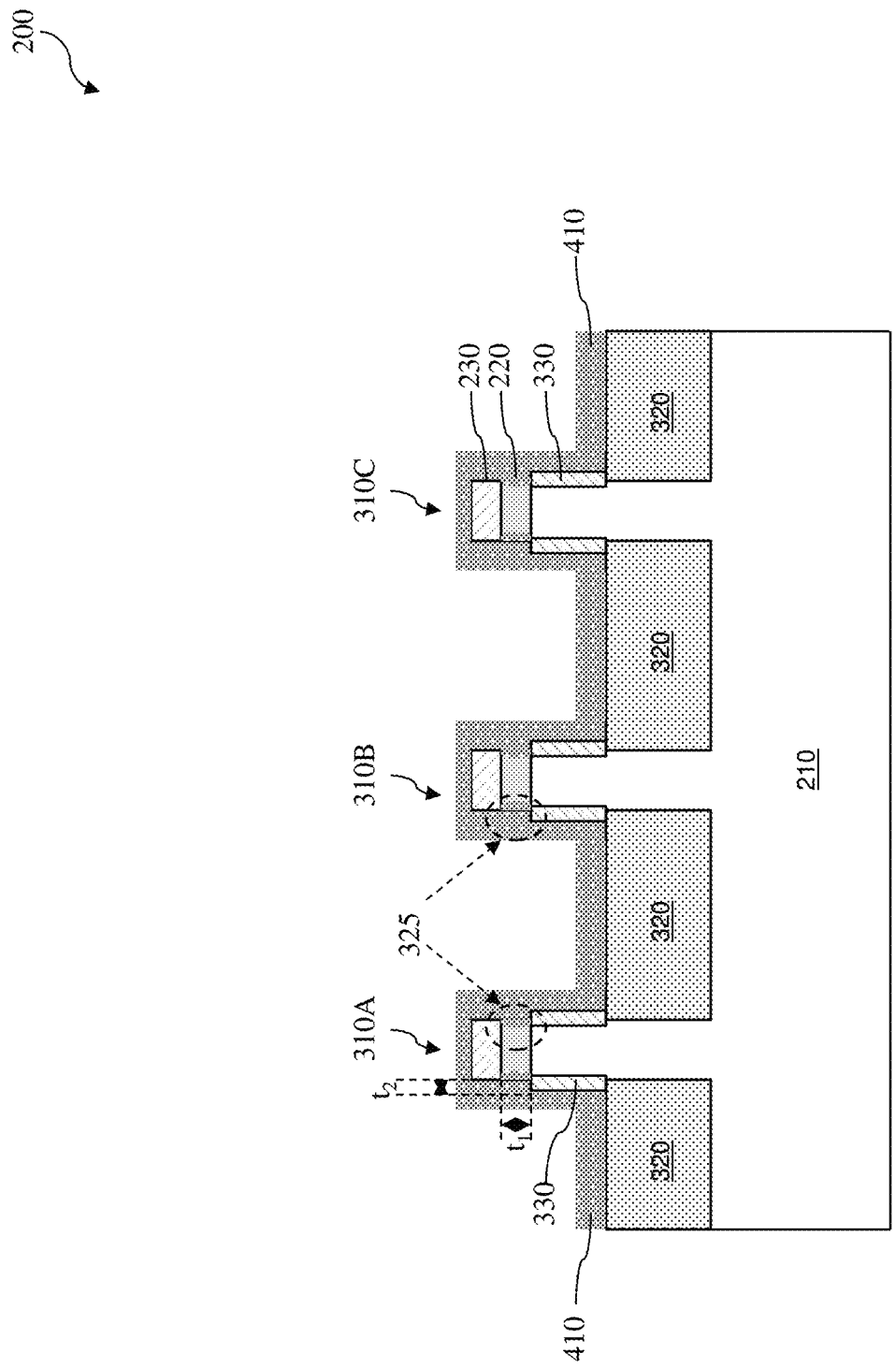

Referring to FIGS. 1 and 6, the method 100 proceeds to step 110 by depositing a protection layer 410 over the substrate 210, including wrapping the fins 310. The protection layer 410 may include a dielectric material (such as silicon nitride or silicon carbide) but is different from the first dielectric layer 220 to achieve etching selectivity during a subsequent etch process. In one embodiment, the first protection layer 410 is silicon nitride. The protection layer 410 may be deposited by CVD, ALD, PVD or other suitable techniques.

Figure 7:
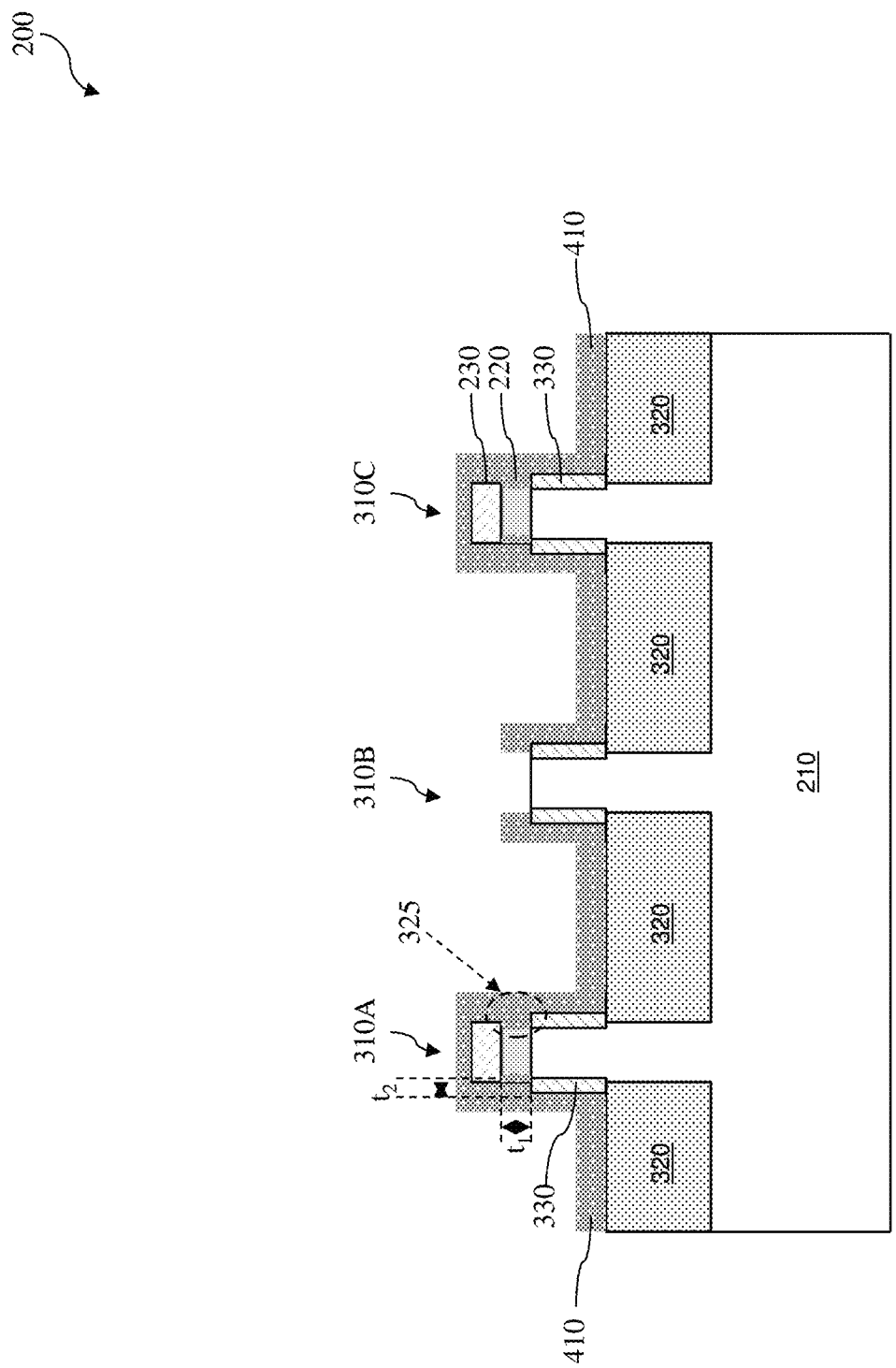

Referring to FIGS. 1 and 7, the method 100 proceeds to step 112 by removing a portion of the protection layer 410, the HM layer 230 and the first dielectric layer 220 of the fin 310B. The removing process may be implemented by photolithography patterning process and etching process. The etching process may include wet etch, dry etch, or a combination of. During etching process, the fin 310A and 310C are protected by a photoresist layer and remain intact. After etching process, the photoresist is removed by wet stripping or plasma ashing.

Figure 8:
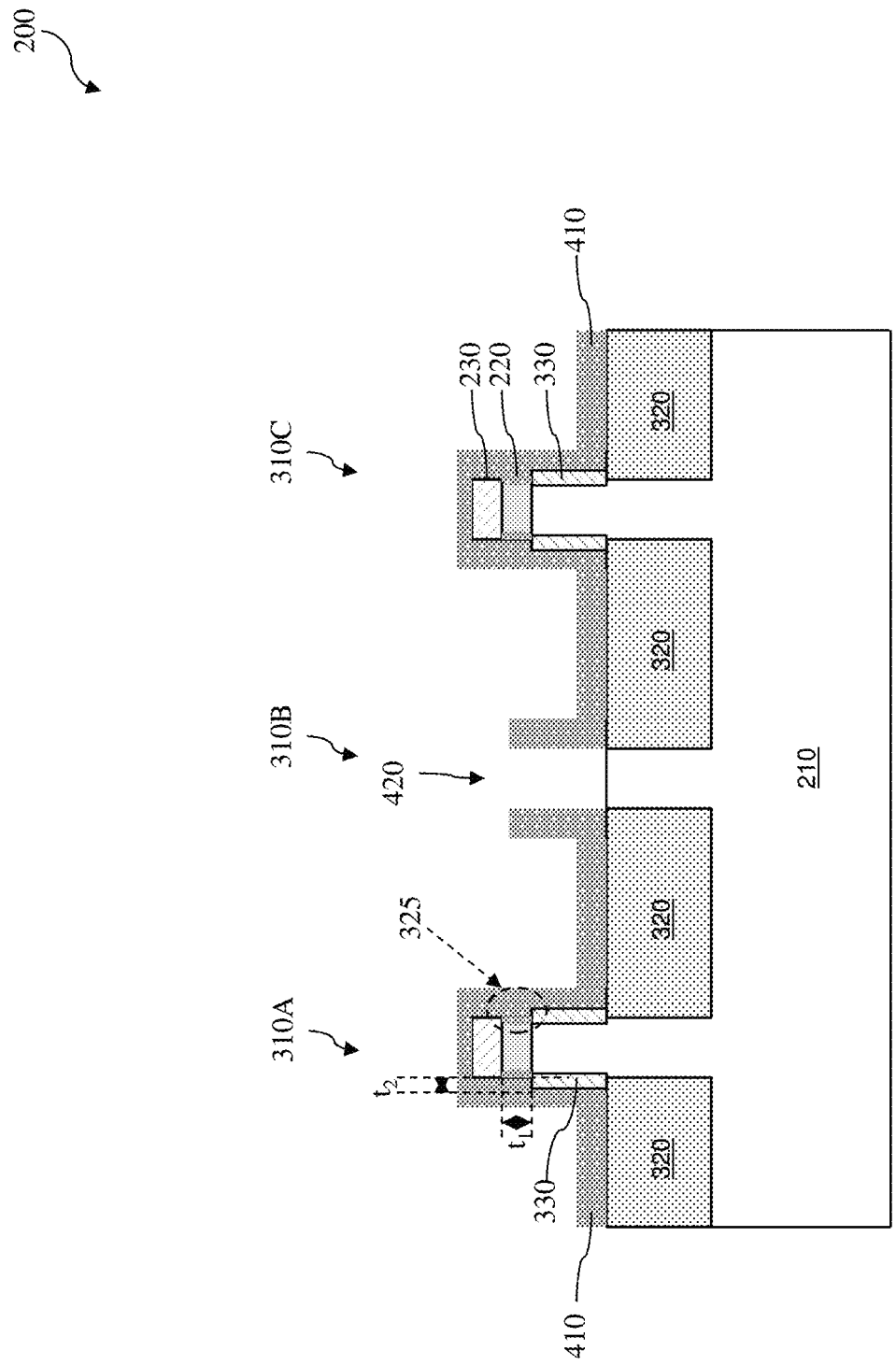

Referring to FIGS. 1 and 8, the method 100 proceeds to step 114 by recessing the fin 310B to form a first trench 420. The recessing process may include a selective wet etch or a selective dry etch, which selectively etches the fin 310B, as well as the second dielectric layer 330, but does not substantially etch the first protection layer 410. Thus the first trench 420 has the first protection layer 410 as its sidewall. A wet etching solution may include TMAH, a $HF/HNO_3/CH_3COOH$ solution, or other suitable solution. Dry etching processes include a biased plasma etching process that uses a chlorine-based chemistry. Other dry etchant gasses include $CF_4/NF_3$, $SF_6/He$, or any other suitable gases. In one embodiment, the second dielectric layer 330 is removed by another etching after recessing the fin 310B. During the recessing process, the fin 310A and the fin 310C are protected by the first protection layer 410 and remain intact.

Figure 9:
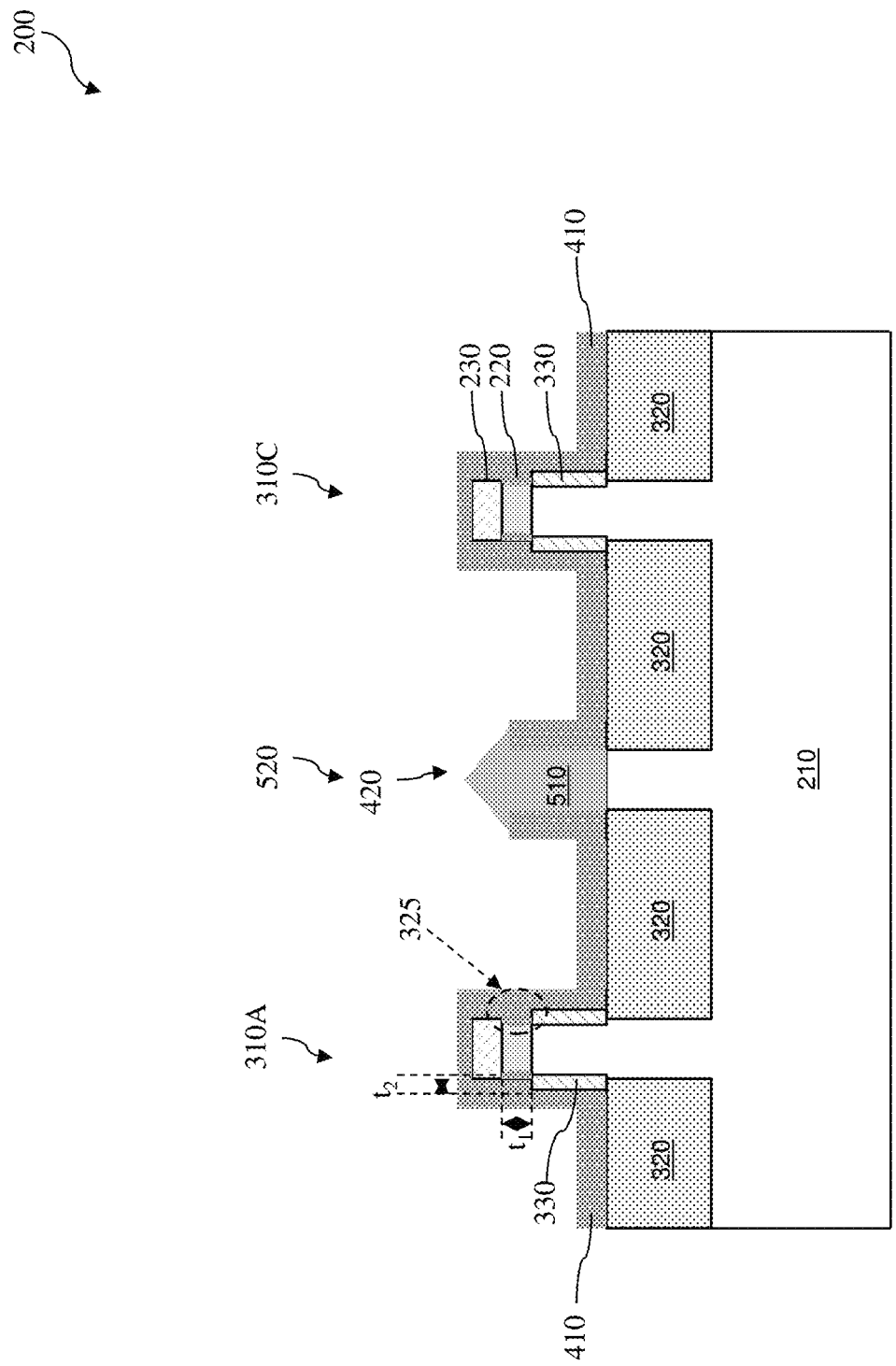

Referring to FIGS. 1 and 9, the method 100 proceeds to step 116 by epitaxially growing a first semiconductor material layer 510 in the first trench 420, over the recessed fin 310B. The sidewalls of the first trench 420 may control the shape of the first semiconductor material layer 510 during its growing. The first semiconductor material layer 510 is formed of a single element semiconductor material such as germanium (Ge) or silicon (Si); or compound semiconductor materials such as gallium arsenide (GaAs), aluminum gallium arsenide (AlGaAs); or semiconductor alloy, such as silicon germanium (SiGe), gallium arsenide phosphide (GaAsP). The epitaxial processes include CVD deposition techniques (e.g., vapor-phase epitaxy (VPE) and/or ultra-high vacuum CVD (UHV-CVD)), molecular beam epitaxy, and/or other suitable processes. From now on, the present disclosure will refer to the first semiconductor material layer 510 deposited over the recessed fin 310B as fin 520; fins 310A and 310C remain.

Figure 10:
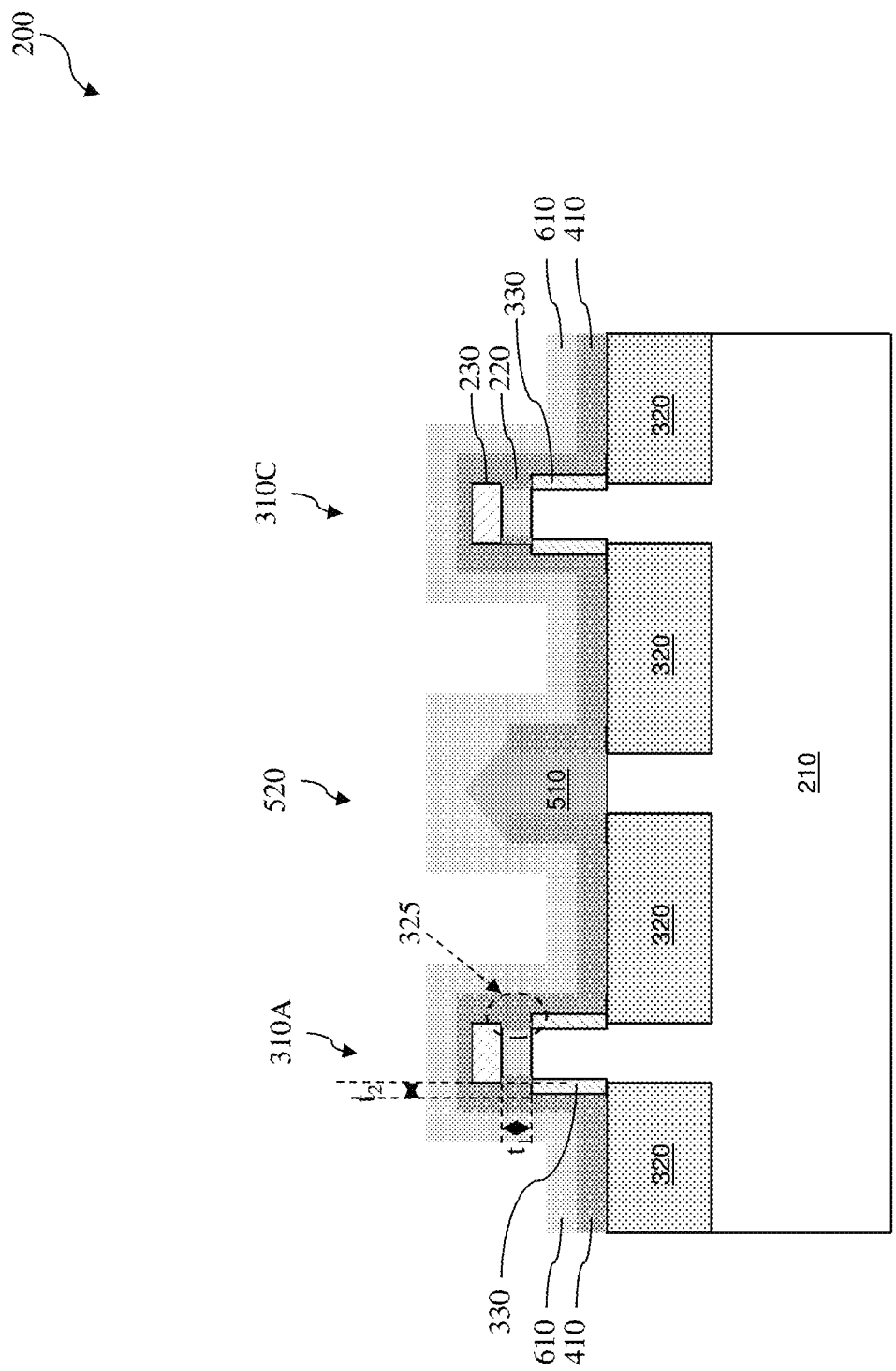

Referring to FIGS. 1 and 10, the method 100 proceeds to step 118 by depositing a second protection layer 610 over the substrate 210, including over the fin 520. The second protection layer 610 may be formed similarly in many respects to the first protection layer 410 discussed above in association with FIG. 6. In one embodiment, the second protection layer 610 has same material as the first protection layer 410.

Figure 11:
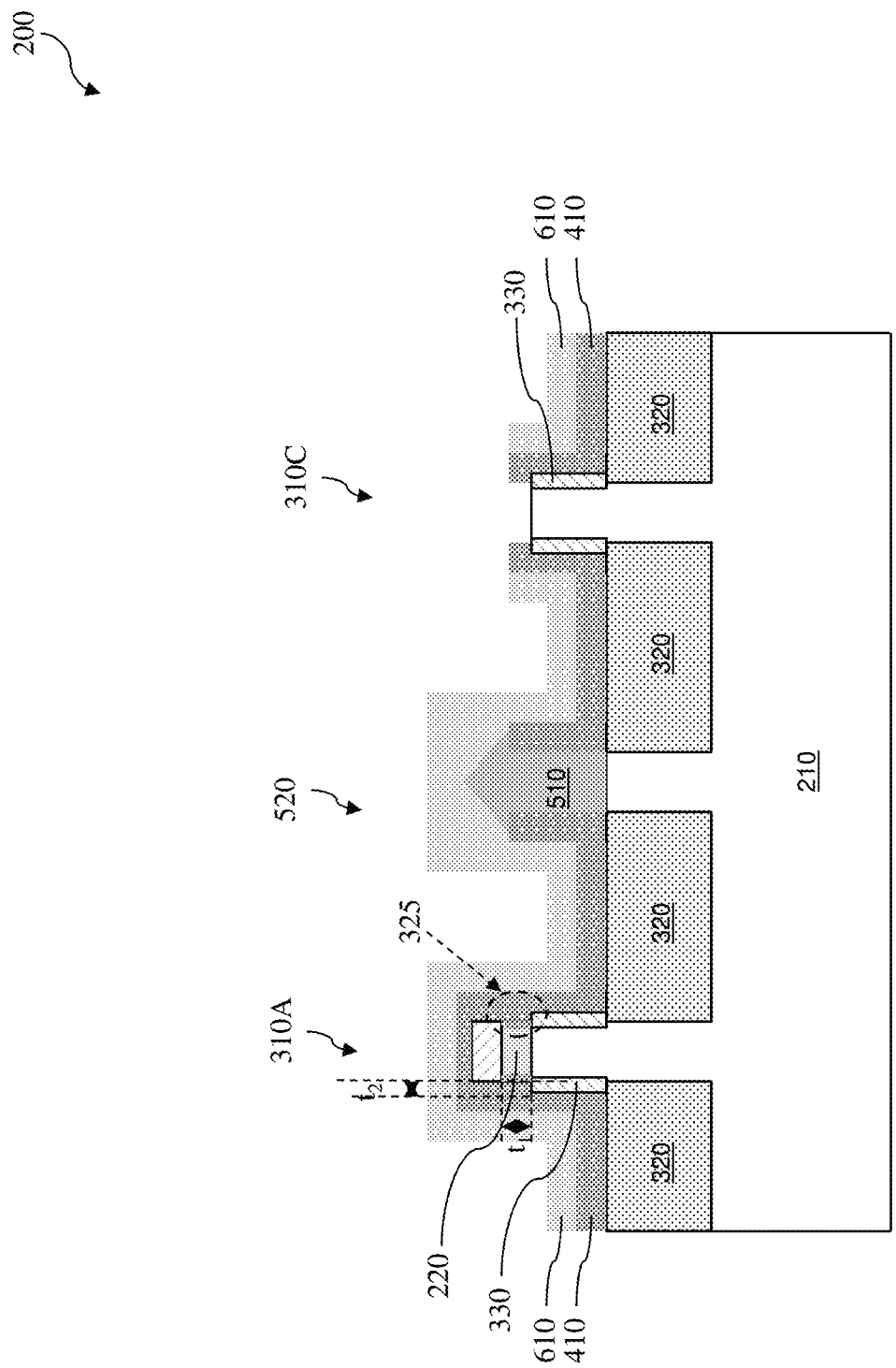
Figure 12:
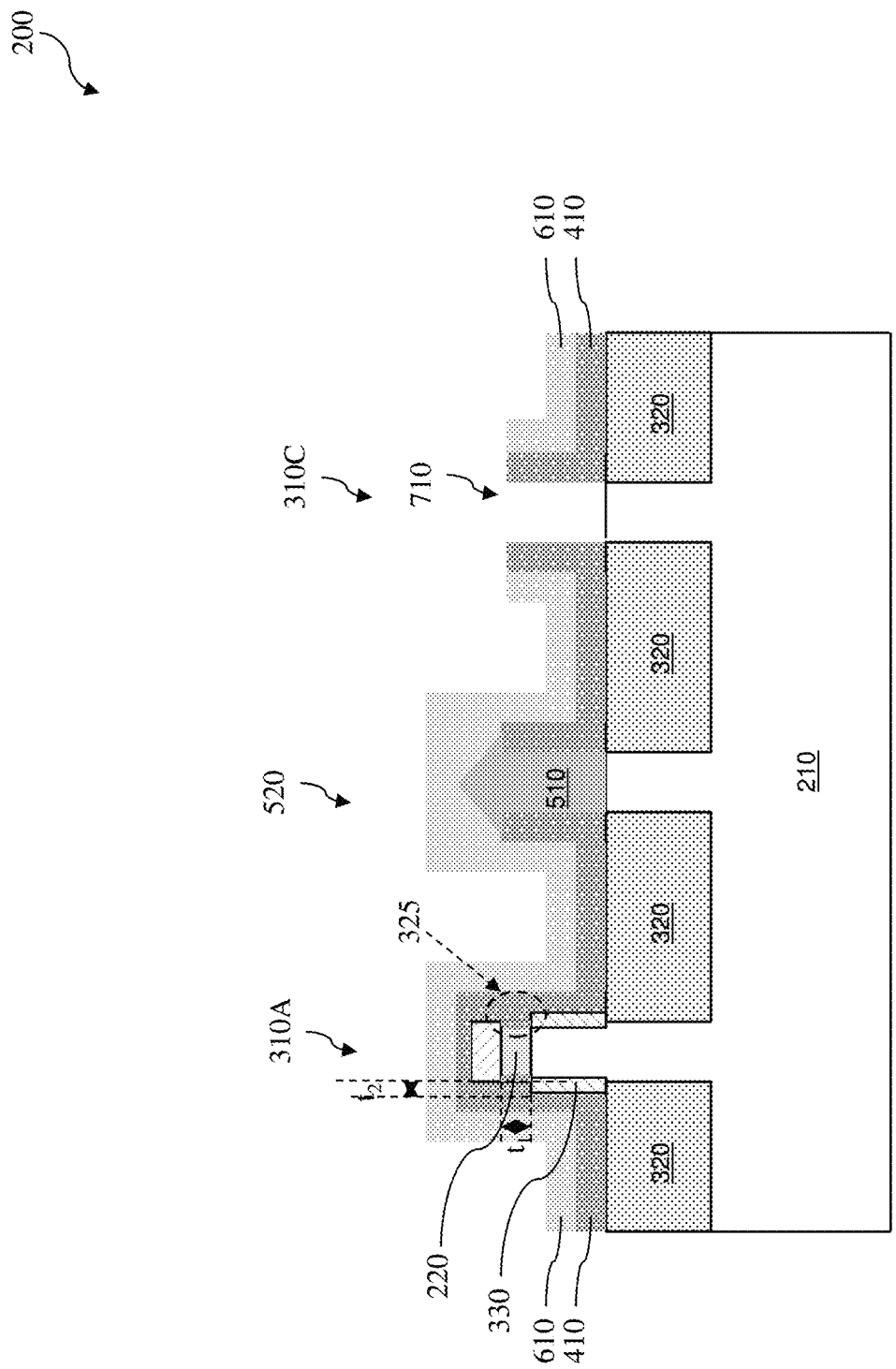

Referring to FIGS. 1 and 11, the method 100 proceeds to step 120 by removing a portion of the second protection layer 610, the HM layer 230 and the first dielectric layer 220 of the fin 310C. The removing process may be performed similarly in many respects to the removing process discussed above in association with FIG. 7. During etching process, the fin 310A and the fin 520 are protected by a photoresist layer and remain intact Referring to FIGS. 1 and 12, the method 100 proceeds to step 122 by recessing the fin 310C to form a second trench 710. The recessing may be performed similarly in many respects to the recessing process discussed above in association with FIG. 8. During the recessing process, the fin 310A and the fin 520 are protected by the second protection layer 610 and remain intact.

Figure 13:
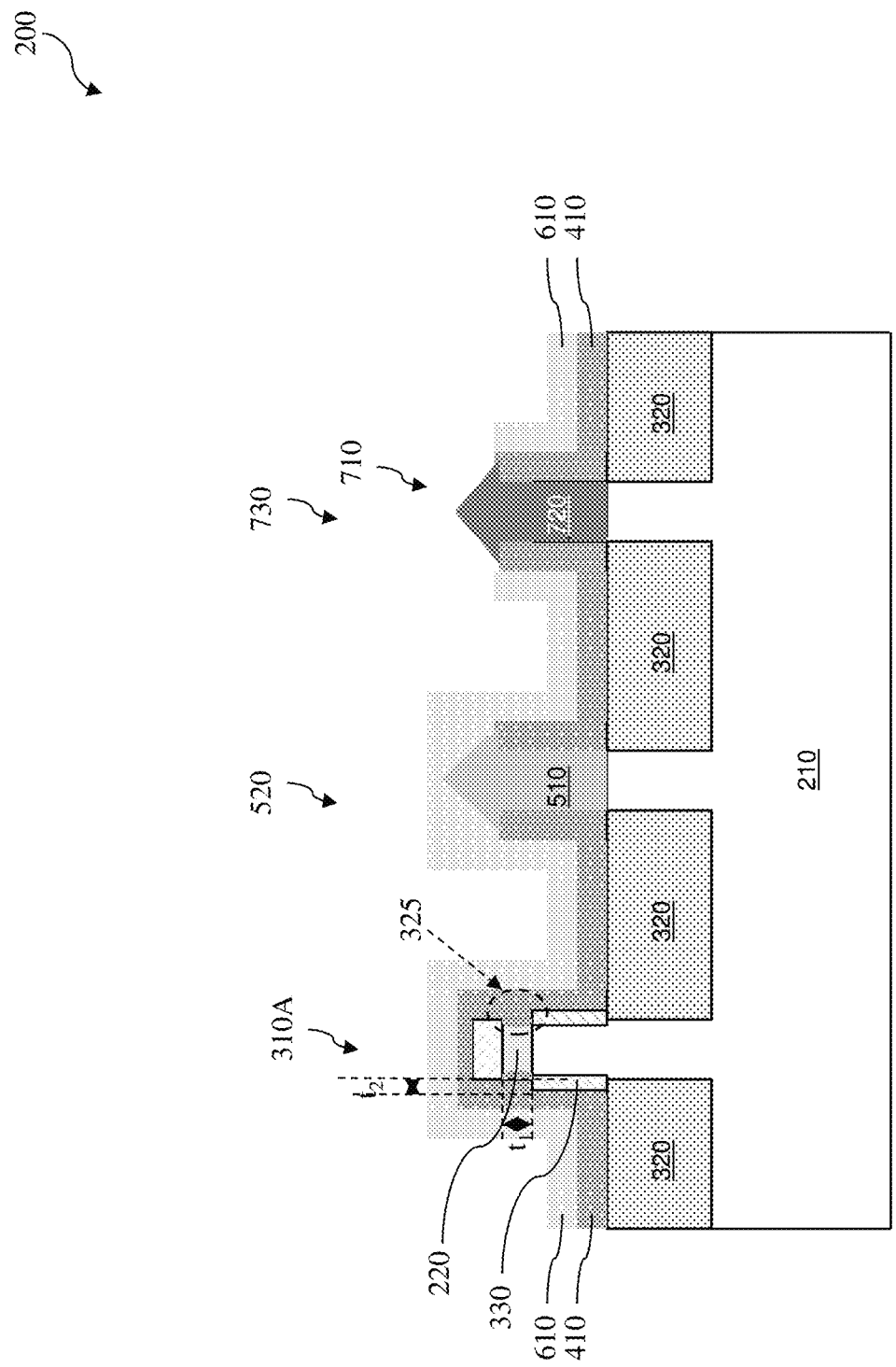

Referring to FIGS. 1 and 13, the method 100 proceeds to step 124 by epitaxially growing a second semiconductor material layer 720 on top of the recessed fin 310C and filling in the trench 710. The second semiconductor material layer 720 is formed of a material of single element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxially growing process may be performed similarly in many respects to the recessing process discussed above in association with FIG. 9. From now on, the present disclosure will refer to the fin having the second semiconductor material layer 710 deposited over the recessed fin 310C as fin 730; fin 520 and 310A remain.

Figure 14:
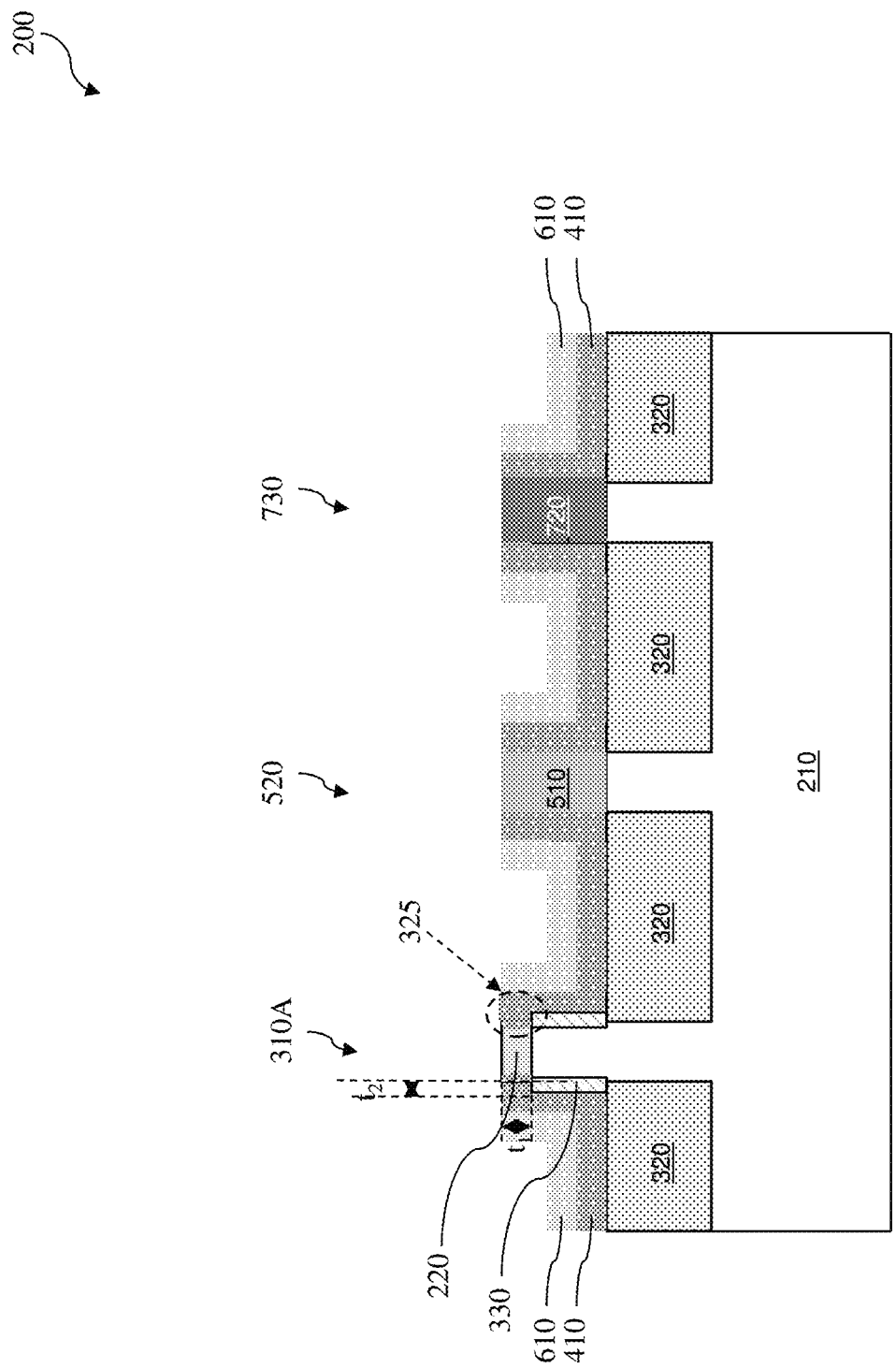

Referring to FIGS. 1 and 14, the method 100 proceeds to step 126 by recessing the second protection layer 610, the first protection layer 410, a portion of the first semiconductor material layer 510 and a portion of the second semiconductor material layer 720. In one embodiment, a CMP is performed to polish back above layers to expose the first dielectric layer 220 of the fin 310A and provide flat surfaces of the fin 520 and the fin 730.

Figure 15:
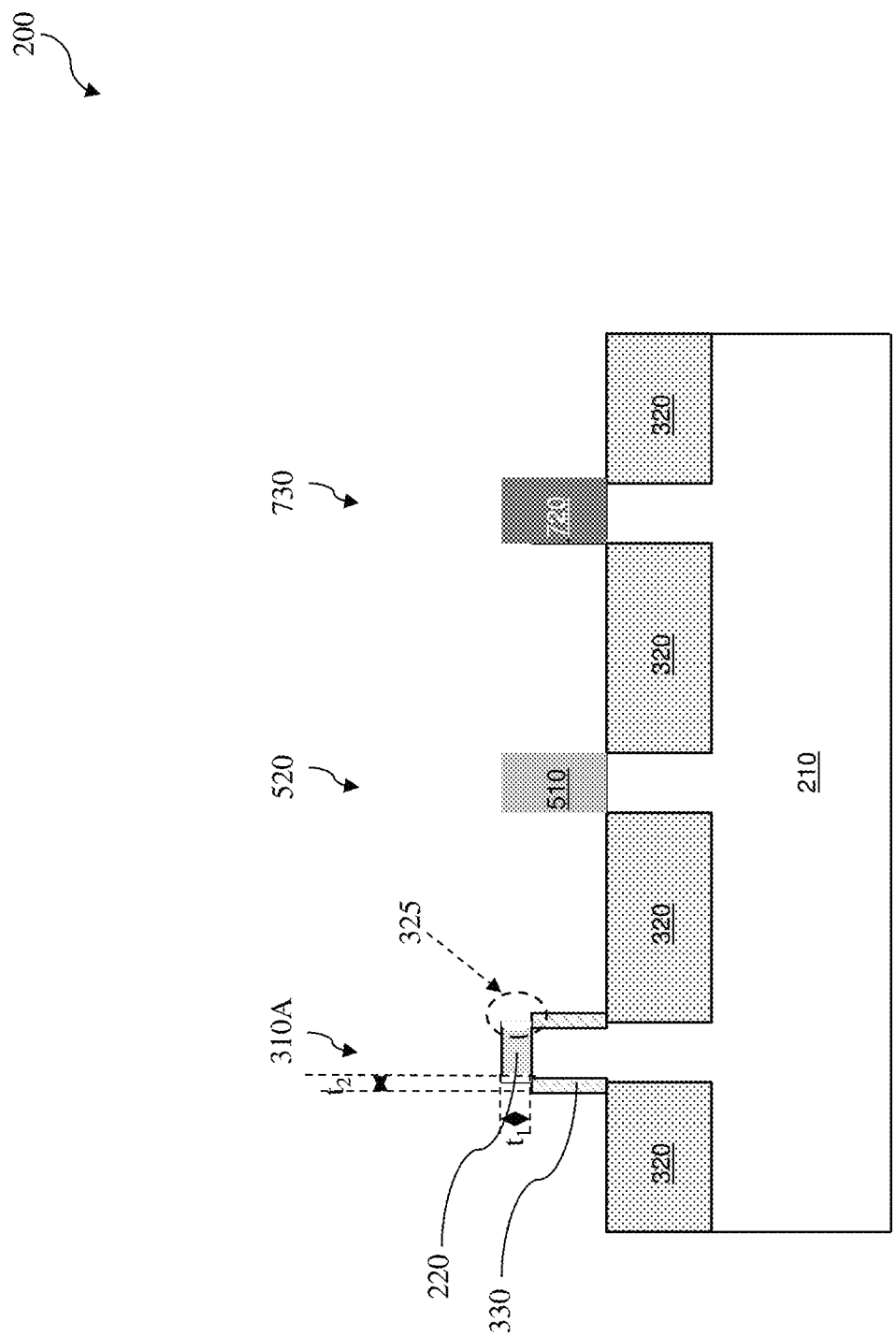

Referring to FIGS. 1 and 15, the method 100 proceeds to step 128 by removing the second protection layer 610 and the first protection layer 410 to reveal the fin 310A, the fin 520 and the fin 730. The etching process may include a selective wet etch or a selective dry etch, which selectively etch the second protection layer 610 and the first protection layer 410, but substantially does not etch the first dielectric layer 220, the second dielectric layer 330, the first semiconductor material layer 510 and the second semiconductor material layer 720. At this step, the fin 310A is revealed having the first dielectric layer 220 at top with the dip-shape profile sidewall 325 and the second dielectric layer 330 along its sidewalls. Also, the fin 510 and the fin 730 are revealed having the first and the second semiconductor layers, 510 and 720, respectively.

Additional steps can be provided before, during, and after the method 100, and some of the steps described can be replaced or eliminated for other embodiments of the method 100.

The device 200 may undergo further CMOS or MOS technology processing to form various features and regions known in the art. For example, high-k/metal gate (HK/MG) stacks are formed over the substrate 210, including over (wrapping) a portion of the fins 310. The HK/MG gate stack may include a dielectric layer and a gate electrode layer. The dielectric layer may include an interfacial layer (IL) and a HK dielectric layer. Examples of high-k dielectric material includes HfO2, HfSiO, HfSiON, HfTaO, HfTiO, HfZrO, zirconium oxide, aluminum oxide, hafnium dioxide-alumina (HfO$_2$—Al$_2$O$_3$) alloy, other suitable high-k dielectric materials, and/or combinations thereof. The gate electrode layers are formed over the dielectric layer by any suitable process. The gate electrode layers may include any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof.

For another example, source and drain (S/D) regions are formed on each side of the gate structure. S/D regions may be formed by recess, epitaxial growth, and implant techniques. Subsequent processing may also form various contacts/vias/lines and multilayers interconnect features (e.g., metal layers and interlayer dielectrics) on the substrate 210, configured to connect the various features or structures of the device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, the present disclosure offers methods for fabricating a FinFET device. The method employs forming dielectric layers over a first fin with a flexibility of different thickness of the dielectric layer on top of the first fin with the dielectric layer along its sidewall. The dielectric layers may serve as a gate dielectric layer for the first fin. The method also employs forming a second fin and a third fin by epitaxially growing different semiconductor material layers separately on the recessed second fin and the recessed third fin after forming the dielectric layer over the first fin. Thus the eptitaxially grown second fin and the third fin don't be impacted adversely by the process temperature during forming the dielectric layer of the first fin.

The present disclosure provides many different embodiments of fabricating a FinFET device that provide one or more improvements over the prior art. In one embodiment, a method for fabricating a FinFET device includes forming a first dielectric layer over a substrate with a first thickness, etching the first dielectric layer and the substrate to form a first fin and a second fin. The first fin and the second fin have the first dielectric layer on top of each of them. The method also includes forming a second dielectric layer along sidewalls of the first fin and the second fin with a second thickness. The second thickness is substantial different with the first thickness. The method also includes forming a protection layer over the first fin and the second fin, removing a portion of the protection layer and the first dielectric layer on the second fin, recessing the second fin to form a trench, epitaxially growing a semiconductor material layer on the recessed second fin in the trench and removing the protection layer to reveal the first fin and the second fin, such as that the first fin is formed by the substrate material having the first dielectric layer on its top and the second dielectric layer on its sidewall and the second fin is formed by the first semiconductor material layer.

In another embodiment, a method for fabricating a FinFET device includes depositing a first dielectric layer over a substrate. The first dielectric layer has a first thickness. The method also includes etching the first dielectric layer and the substrate to form a first fin, a second fin and a third fin. The method also includes forming a second dielectric layer along sidewalls of the first fin, the second fin and the third fin. The second dielectric layer has a second thickness, which is different with the first thickness. The method also includes forming a first semiconductor material layer over the second fin and forming a second semiconductor material layer over the third fin.

In yet another embodiment, a fin field-effect transistor (FinFET) device includes a first fin, a second fin and a third fin over a substrate. The first fin, formed by a first semiconductor material, has a first dielectric layer on its top and a second dielectric layer along its sidewall. A thickness of the first dielectric layer is substantially different to a thickness of the second dielectric layer. At outside edge of the first dielectric layer has a dip-shape profile. The second fin is formed by a second semiconductor material layer and the third fin is formed by a third semiconductor material. The device also includes an isolation region between the first fin, the second fin and the third fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a first fin including a first semiconductor material;
    a first dielectric layer disposed over a top surface of the first fin, wherein a sidewall of the first dielectric layer has a dip-shape profile;
    a second dielectric layer disposed along sidewalls of the first fin, wherein a top surface of the second dielectric layer is substantially coplanar with the top surface of the first fin;
    a second fin including a second semiconductor material different from the first semiconductor material; and
    a first isolation region disposed between the first fin and the second fin.

2. The device of claim 1, wherein a top surface of the second fin is substantially coplanar with a top surface of the first dielectric layer.

3. The device of claim 1, wherein the first dielectric layer has a first thickness,
    wherein the second dielectric layer has a second thickness different from the first thickness.

4. The device of claim 3, wherein the first thickness is greater than the second thickness.

5. The device of claim 1, further comprising:
    an I/O device including the first fin; and
    a first field-effect transistor (FET) including the second fin.

6. The device of claim 5, further comprising:
    a third fin including a third semiconductor material different from the first and second semiconductor materials; and
    a second isolation region disposed between the second fin and the third fin.

7. The device of claim 6, further comprising:
    a second FET including the third fin.

8. The device of claim 1, wherein the first FET is a P-type FET, and the second FET is an N-type FET.

9. A device comprising:
    a first fin including a first semiconductor material;
    a first dielectric layer disposed over a top surface of the first fin;
    a second fin including a second semiconductor material, wherein a top surface of the second fin is substantially coplanar with a top surface of the first dielectric layer;
    an I/O device including the first fin; and
    a first field-effect transistor (FET) including the second fin.

10. The device of claim 9, wherein a sidewall of the first dielectric layer has a dip-shape profile.

11. The device of claim 9, further comprising:
    a second dielectric layer disposed along sidewalls of the first fin, wherein a top surface of the second dielectric layer is substantially coplanar with the top surface of the first fin.

12. The device of claim 11, wherein the first dielectric layer has a first thickness,
    wherein the second dielectric layer has a second thickness less than the first thickness.

13. The device of claim 9, further comprising:
    a third fin including a third semiconductor material different from the first and second semiconductor materials.

14. The device of claim 13, further comprising:
    a second FET including the third fin.

15. The device of claim 14, wherein the first FET is a P-type FET, and the second FET is an N-type FET.

16. A device comprising:
    a first fin including a first semiconductor material and having a first height;
    a second fin including a bottom portion of the first semiconductor material and a top portion of a second semiconductor material different from the first semiconductor material, wherein the second fin has a second height greater than the first height;
    a third fin including a bottom portion of the first semiconductor material and a top portion of a third semiconductor material different from the first and second semiconductor materials, wherein the third fin has a third height greater than the first height; and
    isolation regions disposed between the first fin, the second fin, and the third fin.

17. The device of claim 16, comprising:
    a first dielectric layer disposed over a first top surface of the first fin, wherein a sidewall of the first dielectric layer has a dip-shape profile; and
    a second dielectric layer disposed along sidewalls of the first fin, wherein a second top surface of the second dielectric layer is substantially coplanar with the first top surface of the first fin.

18. The device of claim 17, wherein the first dielectric layer has a first thickness,
    wherein the second dielectric layer has a second thickness different from the first thickness.

19. The device of claim 16, further comprising:
    an I/O device including the first fin;
    a first field-effect transistor (FET) including the second fin; and
    a second FET including the third fin.

* * * * *